US012355415B2

(12) United States Patent
Hiramatsu et al.

(10) Patent No.: US 12,355,415 B2
(45) Date of Patent: Jul. 8, 2025

(54) MULTI-BAND FILTER WITH SUPPRESSED SHEAR HORIZONTAL MODE

(71) Applicant: Skyworks Solutions, Inc., Irvine, CA (US)

(72) Inventors: Yuya Hiramatsu, Neyagawa (JP); Masafumi Iwaki, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 350 days.

(21) Appl. No.: 18/099,841

(22) Filed: Jan. 20, 2023

(65) Prior Publication Data

US 2023/0231529 A1    Jul. 20, 2023

Related U.S. Application Data

(60) Provisional application No. 63/301,405, filed on Jan. 20, 2022.

(51) Int. Cl.
*H03H 7/01* (2006.01)
*H03H 9/64* (2006.01)

(52) U.S. Cl.
CPC ............ *H03H 7/0115* (2013.01); *H03H 9/64* (2013.01); *H03H 2250/00* (2013.01)

(58) Field of Classification Search
CPC .. H03H 9/725; H03H 7/0115; H03H 9/14541; H03H 9/64; H03H 2250/00
See application file for complete search history.

(56) References Cited

U.S. PATENT DOCUMENTS

| | | | |
|---|---|---|---|
| 3,965,444 A | 6/1976 | Willingham et al. | |
| 7,034,635 B2 | 4/2006 | Nakamura et al. | |
| 7,301,420 B2 | 11/2007 | Yamaguchi et al. | |
| 7,557,430 B2 | 7/2009 | Barber et al. | |
| 7,741,931 B2 * | 6/2010 | Matsuda | H03H 9/0222 333/195 |
| 8,564,172 B2 * | 10/2013 | Seki | H03H 3/10 310/313 C |
| 10,483,248 B2 | 11/2019 | Yota et al. | |
| 10,491,194 B2 | 11/2019 | Komatsu et al. | |
| 11,082,023 B2 | 8/2021 | Shin et al. | |
| 11,095,269 B2 | 8/2021 | Komatsu | |
| 11,316,494 B2 | 4/2022 | Liu et al. | |
| 11,323,097 B2 | 5/2022 | Kankar et al. | |
| 11,335,669 B2 | 5/2022 | Yota et al. | |

(Continued)

*Primary Examiner* — Quan Tra
(74) *Attorney, Agent, or Firm* — Knobbe Martens Olson & Bear LLP

(57) ABSTRACT

A multi-band filter configured to allow signals to pass at multiple frequency bands includes a piezoelectric substrate and a plurality of groups of electrodes disposed on the piezoelectric substrate. Each group forms a respective filter to allow signals to pass at a corresponding frequency band. A first group forms a first filter having a first frequency band and a second group forms a second filter having a second frequency band. The first frequency band is lower than the second frequency band. The filter includes a dielectric film formed to cover at least a part of the piezoelectric substrate and the plurality of groups of electrodes. The filter also includes a passivation film disposed on the dielectric film. The passivation film has a smaller thickness for the first group than for the second group, so as to suppress a spurious response generated in the piezoelectric substrate.

20 Claims, 12 Drawing Sheets

(56) References Cited

U.S. PATENT DOCUMENTS

| | | |
|---|---|---|
| 11,349,454 B2 | 5/2022 | Shin et al. |
| 11,368,137 B2 | 6/2022 | Goto et al. |
| 11,387,808 B2 | 7/2022 | Shin et al. |
| 11,405,013 B2 | 8/2022 | Shin et al. |
| 11,424,732 B2 | 8/2022 | Shin et al. |
| 11,437,976 B2 | 9/2022 | Kaneda et al. |
| 11,522,513 B2 | 12/2022 | Shin et al. |
| 11,522,515 B2 | 12/2022 | Matsuda et al. |
| 11,581,869 B2 | 2/2023 | Shin et al. |
| 2004/0251987 A1 | 12/2004 | Nakamura et al. |
| 2006/0139120 A1 | 6/2006 | Yamaguchi et al. |
| 2007/0284762 A1 | 12/2007 | Barber et al. |
| 2008/0238572 A1 | 10/2008 | Funami et al. |
| 2009/0045703 A1 | 2/2009 | Barber et al. |
| 2009/0066189 A1 | 3/2009 | Kando |
| 2010/0068831 A1 | 3/2010 | Barber et al. |
| 2010/0141088 A1* | 6/2010 | Matsuda ............ H03H 9/02574 |
| | | 310/313 R |
| 2013/0285504 A1 | 10/2013 | Tamasaki |
| 2014/0167881 A1 | 6/2014 | Iwasaki et al. |
| 2018/0269848 A1 | 9/2018 | Matsuda et al. |
| 2018/0277527 A1 | 9/2018 | Yota et al. |
| 2019/0288664 A1 | 9/2019 | Saji |
| 2019/0386642 A1 | 12/2019 | Komatsu et al. |
| 2020/0083202 A1 | 3/2020 | Yota et al. |
| 2020/0099359 A1 | 3/2020 | Shin et al. |
| 2020/0212875 A1 | 7/2020 | Goto et al. |
| 2020/0212876 A1 | 7/2020 | Goto et al. |
| 2020/0212878 A1 | 7/2020 | Shin et al. |
| 2020/0212882 A1 | 7/2020 | Shin et al. |
| 2020/0212883 A1 | 7/2020 | Goto et al. |
| 2020/0212884 A1 | 7/2020 | Shin et al. |
| 2020/0274515 A1 | 8/2020 | Shin et al. |
| 2020/0274520 A1 | 8/2020 | Shin et al. |
| 2020/0304104 A1* | 9/2020 | Araki ................ H03H 9/6489 |
| 2020/0389151 A1 | 12/2020 | Goto |
| 2020/0395911 A1 | 12/2020 | Liu et al. |
| 2021/0044278 A1 | 2/2021 | Kankar et al. |
| 2021/0083643 A1 | 3/2021 | Liu et al. |
| 2021/0105005 A1 | 4/2021 | Kankar et al. |
| 2021/0105006 A1 | 4/2021 | Kankar et al. |
| 2021/0111692 A1 | 4/2021 | Liu et al. |
| 2021/0126612 A1 | 4/2021 | Hiramatsu et al. |
| 2021/0126616 A1 | 4/2021 | Hiramatsu et al. |
| 2021/0126617 A1 | 4/2021 | Fukuhara et al. |
| 2021/0126618 A1 | 4/2021 | Hiramatsu et al. |
| 2021/0135654 A1 | 5/2021 | Fukuhara et al. |
| 2021/0135655 A1 | 5/2021 | Fukuhara et al. |
| 2021/0159876 A1 | 5/2021 | Maki et al. |
| 2021/0159879 A1 | 5/2021 | Caron et al. |
| 2021/0159880 A1 | 5/2021 | Caron et al. |
| 2021/0159881 A1 | 5/2021 | Caron et al. |
| 2021/0203305 A1 | 7/2021 | Maki et al. |
| 2021/0281246 A1 | 9/2021 | Maki et al. |
| 2021/0336605 A1 | 10/2021 | Komatsu |
| 2021/0344321 A1 | 11/2021 | Shin et al. |
| 2022/0094323 A1 | 3/2022 | Zhang et al. |
| 2022/0094324 A1 | 3/2022 | Zhang et al. |
| 2022/0094335 A1 | 3/2022 | Zhang et al. |
| 2022/0103150 A1 | 3/2022 | Shin et al. |
| 2022/0103151 A1 | 3/2022 | Shin et al. |
| 2022/0103152 A1 | 3/2022 | Shin et al. |
| 2022/0103159 A1 | 3/2022 | Shin et al. |
| 2022/0200571 A1 | 6/2022 | Wang et al. |
| 2022/0200572 A1 | 6/2022 | Wang et al. |
| 2022/0209738 A1 | 6/2022 | Torazawa et al. |
| 2022/0209743 A1 | 6/2022 | Liu et al. |
| 2022/0209747 A1 | 6/2022 | Wang et al. |
| 2022/0209749 A1 | 6/2022 | Wang et al. |
| 2022/0263495 A1 | 8/2022 | Wang et al. |
| 2022/0271730 A1 | 8/2022 | Abbott et al. |
| 2022/0271733 A1 | 8/2022 | Abbott et al. |
| 2022/0271734 A1 | 8/2022 | Abbott et al. |
| 2022/0286105 A1 | 9/2022 | Goto et al. |
| 2022/0311410 A1 | 9/2022 | Komatsu et al. |
| 2022/0311411 A1 | 9/2022 | Liu et al. |
| 2022/0311412 A1 | 9/2022 | Liu et al. |
| 2022/0311419 A1 | 9/2022 | Komatsu et al. |
| 2022/0321080 A1 | 10/2022 | Shirakawa et al. |
| 2022/0321095 A1 | 10/2022 | Liu et al. |
| 2022/0321100 A1 | 10/2022 | Liu et al. |
| 2022/0321101 A1 | 10/2022 | Liu et al. |
| 2022/0321102 A1 | 10/2022 | Shirakawa et al. |
| 2022/0332568 A1 | 10/2022 | Barsukou et al. |
| 2022/0337219 A1 | 10/2022 | Kovacic et al. |
| 2022/0368311 A1 | 11/2022 | Shin et al. |
| 2022/0368312 A1 | 11/2022 | Wang et al. |
| 2022/0393664 A1 | 12/2022 | Liu et al. |
| 2023/0006642 A1 | 1/2023 | Liu et al. |
| 2023/0008248 A1 | 1/2023 | Komatsu et al. |
| 2023/0009576 A1 | 1/2023 | Komatsu et al. |
| 2023/0010291 A1 | 1/2023 | Komatsu et al. |
| 2023/0013541 A1 | 1/2023 | Caron et al. |
| 2023/0016884 A1 | 1/2023 | Goto et al. |
| 2023/0024270 A1 | 1/2023 | Caron et al. |
| 2023/0026465 A1 | 1/2023 | Huang et al. |
| 2023/0027129 A1 | 1/2023 | Caron et al. |
| 2023/0043197 A1 | 2/2023 | Fujiwara et al. |
| 2023/0070350 A1 | 3/2023 | Goto |
| 2023/0074757 A1 | 3/2023 | Shin et al. |

\* cited by examiner

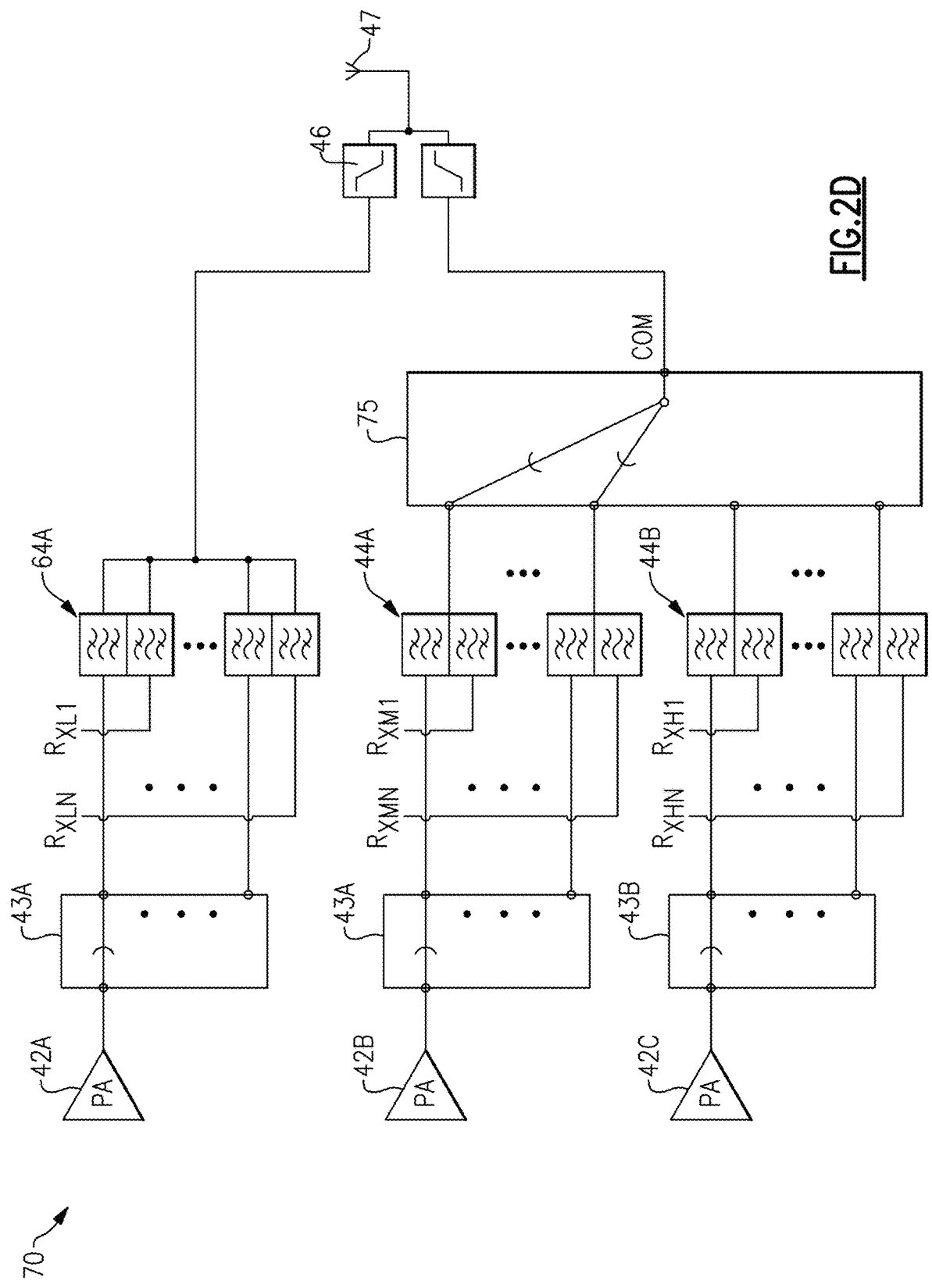

MULTI-BAND FILTER WITH SUPPRESSED SHEAR HORIZONTAL MODE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to a filter for use in radio frequency (RF) electronics.

Description of the Related Technology

Filters are used in radio frequency (RF) communication systems to allow signals to pass through at discreet frequencies but reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter module include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In some aspects, the techniques described herein relate to a multi-band filter configured to allow signals to pass at multiple frequency bands, the multi-band filter including: a piezoelectric substrate; a plurality of groups of electrodes disposed on the piezoelectric substrate, each group of the plurality of groups of electrodes forming a respective filter to allow signals to pass at a corresponding frequency band of the multiple frequency bands, a first group of the plurality of groups of electrodes forming a first filter having a first frequency band and a second group of the plurality of groups of electrodes forming a second filter having a second frequency band, the first frequency band lower than the second frequency band; a dielectric film formed to cover at least a part of the piezoelectric substrate and the plurality of groups of electrodes; and a passivation film disposed on the dielectric film, the passivation film having a smaller thickness for the first group than for the second group, so as to suppress a spurious response generated in the piezoelectric substrate.

In some aspects, the techniques described herein relate to a multi-band filter wherein the passivation film is an outermost layer in the multi-band filter.

In some aspects, the techniques described herein relate to a multi-band filter wherein the spurious response generated in the piezoelectric substrate is a shear horizontal (SH) wave.

In some aspects, the techniques described herein relate to a multi-band filter wherein a thickness of the passivation film for the first group of the plurality of groups of electrodes is determined further depending on a material that is used for the first group of the plurality of groups of electrodes.

In some aspects, the techniques described herein relate to a multi-band filter wherein each group of the plurality of groups of electrodes includes an upper portion and a lower portion.

In some aspects, the techniques described herein relate to a multi-band filter wherein the upper portion and the lower portion of each of the plurality of groups of electrodes are formed of one of aluminum (Al), aluminum-magnesium-copper (AlMgCu) alloy, tungsten (W), platinum (Pt), and molybdenum (Mo).

In some aspects, the techniques described herein relate to a multi-band filter wherein a thickness of the passivation film for the first group of the plurality of groups of electrodes is determined further depending on a thickness of the dielectric film covering the first group of the plurality of groups of electrodes.

In some aspects, the techniques described herein relate to a multi-band filter wherein the passivation film is formed of silicon nitride (SiN).

In some aspects, the techniques described herein relate to a multi-band filter wherein the dielectric film is formed of silicon dioxide (SiO2).

In some aspects, the techniques described herein relate to a multi-band filter wherein the piezoelectric substrate is formed of lithium niobate (LN).

In some aspects, the techniques described herein relate to a multi-band filter wherein the piezoelectric substrate has a cut angle that suppresses the spurious response generated in the piezoelectric substrate in at least one of the multiple frequency bands.

In some aspects, the techniques described herein relate to a multi-band filter wherein the dielectric film has a different thickness for the first group of the plurality of groups of electrodes from the second group of the plurality of groups of electrodes.

In some aspects, the techniques described herein relate to a radio frequency module including: a packaging board configured to receive a plurality of components; a multi-band filter implemented on the packaging board, the multi-band filter including: a piezoelectric substrate; a plurality of groups of electrodes disposed on the piezoelectric substrate, each group of the plurality of groups of electrodes forming a respective filter to allow signals to pass at a corresponding frequency band of multiple frequency bands, a first group of the plurality of groups of electrodes forming a first filter having a first frequency band and a second group of the plurality of groups of electrodes forming a second filter having a second frequency band, the first frequency band lower than the second frequency band; a dielectric film formed to cover at least a part of the piezoelectric substrate and the plurality of groups of electrodes; and a passivation film disposed on the dielectric film, the passivation film having a smaller thickness for the first group than for the second group, so as to suppress a spurious response generated in the piezoelectric substrate.

In some aspects, the techniques described herein relate to a radio frequency module wherein the passivation film is an outermost layer in the multi-band filter.

In some aspects, the techniques described herein relate to a radio frequency module wherein the radio frequency module is a front-end module.

In some aspects, the techniques described herein relate to a radio frequency module wherein the spurious response generated in the piezoelectric substrate is a shear horizontal (SH) wave.

In some aspects, the techniques described herein relate to a radio frequency module wherein a thickness of the passivation film for the first group of the plurality of groups of electrodes is determined further depending on a material that is used for the first group of the plurality of groups of electrodes.

In some aspects, the techniques described herein relate to a radio frequency module wherein each group of the plurality of groups of electrodes includes an upper portion and a lower portion.

In some aspects, the techniques described herein relate to a radio frequency module wherein the upper portion and the lower portion of each of the plurality of groups of electrodes are formed of one of aluminum (Al), aluminum-magnesium-copper (AlMgCu) alloy, tungsten (W), platinum (Pt), and molybdenum (Mo).

In some aspects, the techniques described herein relate to a radio frequency module wherein a thickness of the passivation film for the first group of the plurality of groups of electrodes is determined further depending on a thickness of the dielectric film covering the first group of the plurality of groups of electrodes.

In some aspects, the techniques described herein relate to a radio frequency module wherein the passivation film is formed of silicon nitride (SiN).

In some aspects, the techniques described herein relate to a radio frequency module wherein the dielectric film is formed of silicon dioxide (SiO2).

In some aspects, the techniques described herein relate to a radio frequency module wherein the piezoelectric substrate is formed of lithium niobate (LN).

In some aspects, the techniques described herein relate to a radio frequency module wherein the piezoelectric substrate has a cut angle that suppresses the spurious response generated in the piezoelectric substrate in at least one of the multiple frequency bands.

In some aspects, the techniques described herein relate to a radio frequency module wherein the dielectric film has a different thickness for the first group of the plurality of groups of electrodes from the second group of the plurality of groups of electrodes.

In some aspects, the techniques described herein relate to a mobile device including: an antenna configured to receive a radio frequency signal; and a front end system configured to communicate with the antenna, the front end system including a multi-band filter including: a piezoelectric substrate; a plurality of groups of electrodes disposed on the piezoelectric substrate, each group of the plurality of groups of electrodes forming a respective filter to allow signals to pass at a corresponding frequency band of multiple frequency bands, a first group of the plurality of groups of electrodes forming a first filter having a first frequency band and a second group of the plurality of groups of electrodes forming a second filter having a second frequency band, the first frequency band lower than the second frequency band; a dielectric film formed to cover at least a part of the piezoelectric substrate and the plurality of groups of electrodes; and a passivation film disposed on the dielectric film, the passivation film having a smaller thickness for the first group than for the second group, so as to suppress a spurious response generated in the piezoelectric substrate.

In some aspects, the techniques described herein relate to a mobile device wherein the passivation film is an outermost layer in the multi-band filter.

In some aspects, the techniques described herein relate to a mobile device wherein the spurious response generated in the piezoelectric substrate is a shear horizontal (SH) wave.

In some aspects, the techniques described herein relate to a mobile device wherein a thickness of the passivation film for the first group of the plurality of groups of electrodes is determined further depending on a material that is used for the first group of the plurality of groups of electrodes.

In some aspects, the techniques described herein relate to a mobile device wherein each group of the plurality of groups of electrodes includes an upper portion and a lower portion.

In some aspects, the techniques described herein relate to a mobile device wherein the upper portion and the lower portion of each of the plurality of groups of electrodes are formed of one of aluminum (Al), aluminum-magnesium-copper (AlMgCu) alloy, tungsten (W), platinum (Pt), and molybdenum (Mo).

In some aspects, the techniques described herein relate to a mobile device wherein a thickness of the passivation film for the first group of the plurality of groups of electrodes is determined further depending on a thickness of the dielectric film covering the first group of the plurality of groups of electrodes.

In some aspects, the techniques described herein relate to a mobile device wherein the passivation film is formed of silicon nitride (SiN).

In some aspects, the techniques described herein relate to a mobile device wherein the dielectric film is formed of silicon dioxide (SiO2).

In some aspects, the techniques described herein relate to a mobile device wherein the piezoelectric substrate is formed of lithium niobate (LN).

In some aspects, the techniques described herein relate to a mobile device wherein the piezoelectric substrate has a cut angle that suppresses the spurious response generated in the piezoelectric substrate in at least one of the multiple frequency bands.

In some aspects, the techniques described herein relate to a mobile device wherein the dielectric film has a different thickness for the first group of the plurality of groups of electrodes from the second group of the plurality of groups of electrodes.

BRIEF DESCRIPTION OF THE DRAWINGS

FIGS. 2A-2D show carrier aggregation systems according to certain embodiments.

FIG. 2A is a first schematic diagram of a carrier aggregation system.

FIG. 2B is a second schematic diagram of a carrier aggregation system.

FIG. 2C is a third schematic diagram of a carrier aggregation system.

FIG. 2D is a fourth schematic diagram of a carrier aggregation system.

DETAILED DESCRIPTION OF EMBODIMENTS

Figure 1:
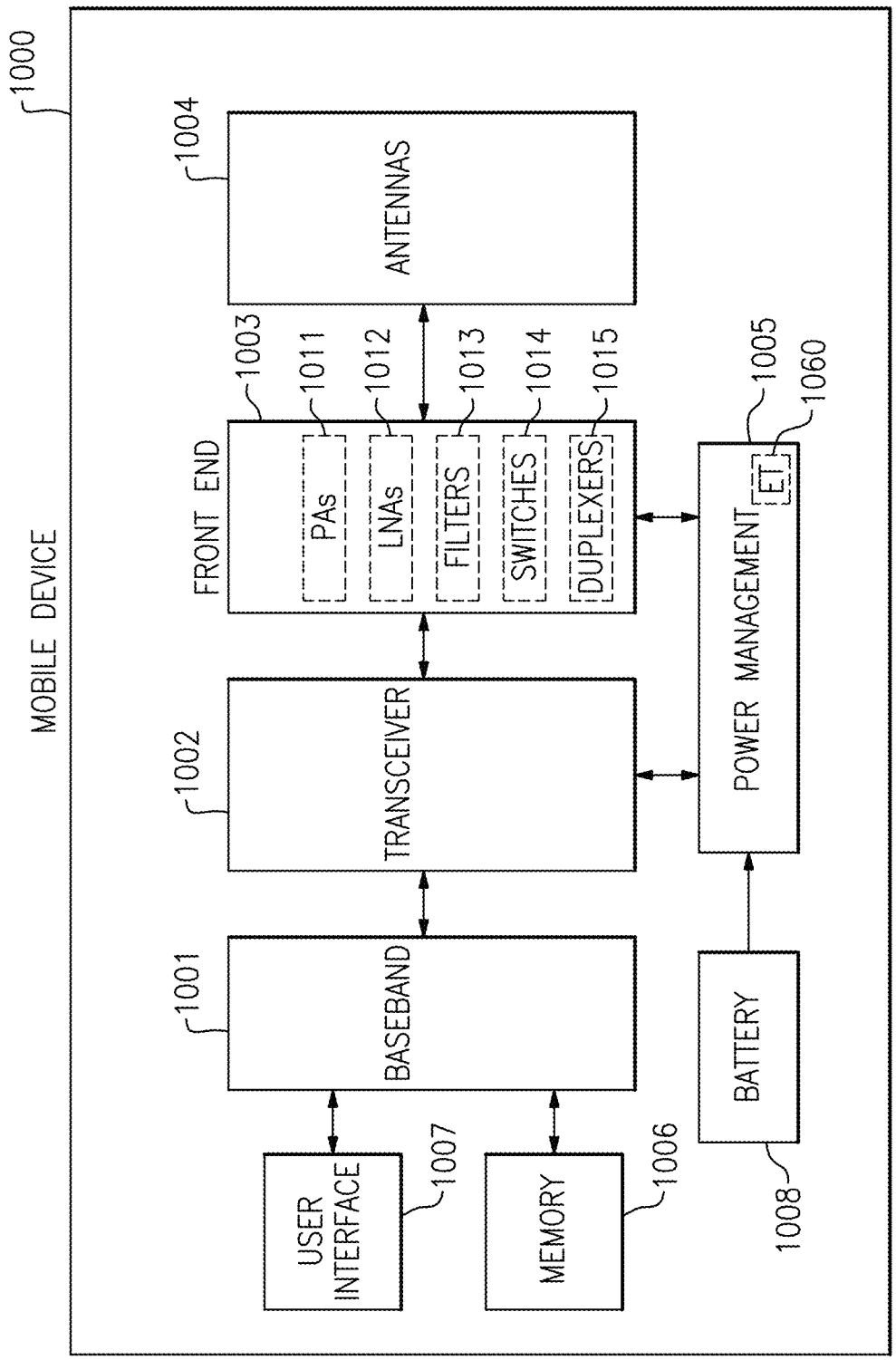
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 1000. The mobile device 1000 includes a baseband system 1001, a transceiver 1002, a front end system 1003, antennas 1004, a power management system 1005, a memory 1006, a user interface 1007, and a battery 1008.

The mobile device 1000 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 1002 generates RF signals for transmission and processes incoming RF signals received from the antennas 1004. It will be understood that various functionalities associated with the transmission and receiving of RF signals can be achieved by one or more components that are collectively represented in FIG. 1 as the transceiver 1002. In one example, separate components (for instance, separate circuits or dies) can be provided for handling certain types of RF signals.

The front end system 1003 aids in conditioning signals transmitted to and/or received from the antennas 1004. In the illustrated embodiment, the front end system 1003 includes power amplifiers (PAs) 1011, low noise amplifiers (LNAs) 1012, filters 1013, switches 1014, and duplexers 1015. However, other implementations are possible.

For example, the front end system 1003 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1000 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 1004 can include antennas used for a wide variety of types of communications. For example, the antennas 1004 can include antennas associated transmitting and/or receiving signals associated with a wide variety of frequencies and communications standards.

In certain implementations, the antennas 1004 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1000 can operate with beamforming in certain implementations. For example, the front end system 1003 can include phase shifters having variable phase controlled by the transceiver 1002. Additionally, the phase shifters are controlled to provide beam formation and directivity for transmission and/or reception of signals using the antennas 1004. For example, in the context of signal transmission, the phases of the transmit signals provided to the antennas 1004 are controlled such that radiated signals from the antennas 1004 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1004 from a particular direction. In certain implementations, the antennas 1004 include one or more arrays of antenna elements to enhance beamforming.

The baseband system 1001 is coupled to the user interface 1007 to facilitate processing of various user input and output (I/O), such as voice and data. The baseband system 1001 provides the transceiver 1002 with digital representations of transmit signals, which the transceiver 1002 processes to generate RF signals for transmission. The baseband system 1001 also processes digital representations of received signals provided by the transceiver 1002. As shown in FIG. 1, the baseband system 1001 is coupled to the memory 1006 of facilitate operation of the mobile device 1000.

The memory 1006 can be used for a wide variety of purposes, such as storing data and/or instructions to facilitate the operation of the mobile device 1000 and/or to provide storage of user information.

The power management system 1005 provides a number of power management functions of the mobile device 1000. The power management system 1005 of FIG. 1 includes an envelope tracker 1060. As shown in FIG. 1, the power management system 1005 receives a battery voltage form the battery 1008. The battery 1008 can be any suitable battery for use in the mobile device 1000, including, for example, a lithium-ion battery.

The mobile device 1000 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
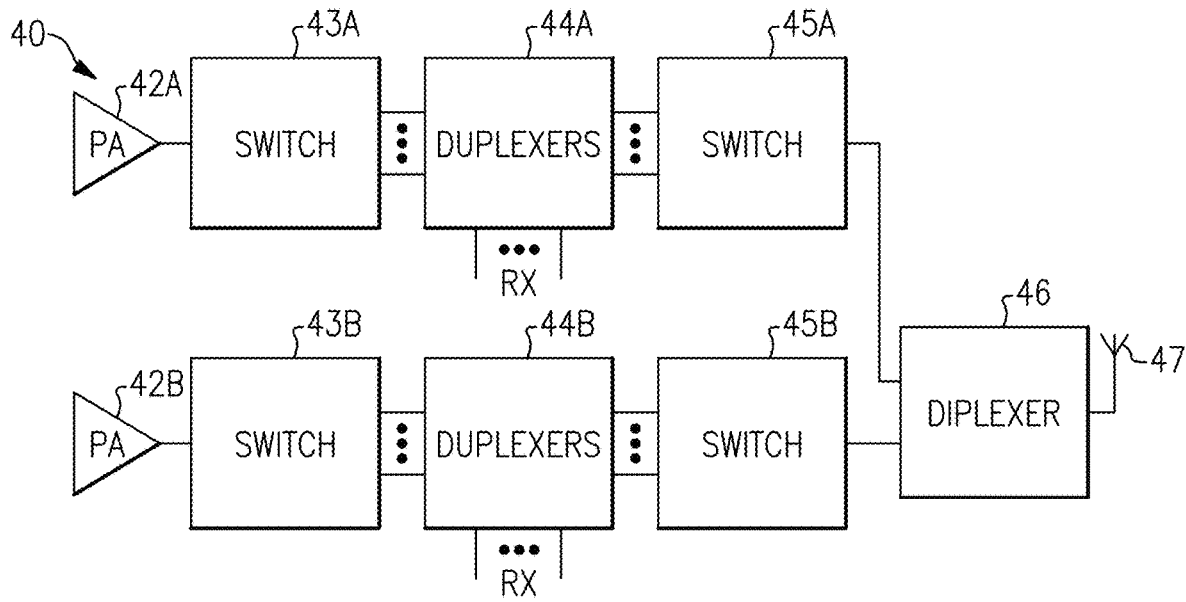

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexers 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
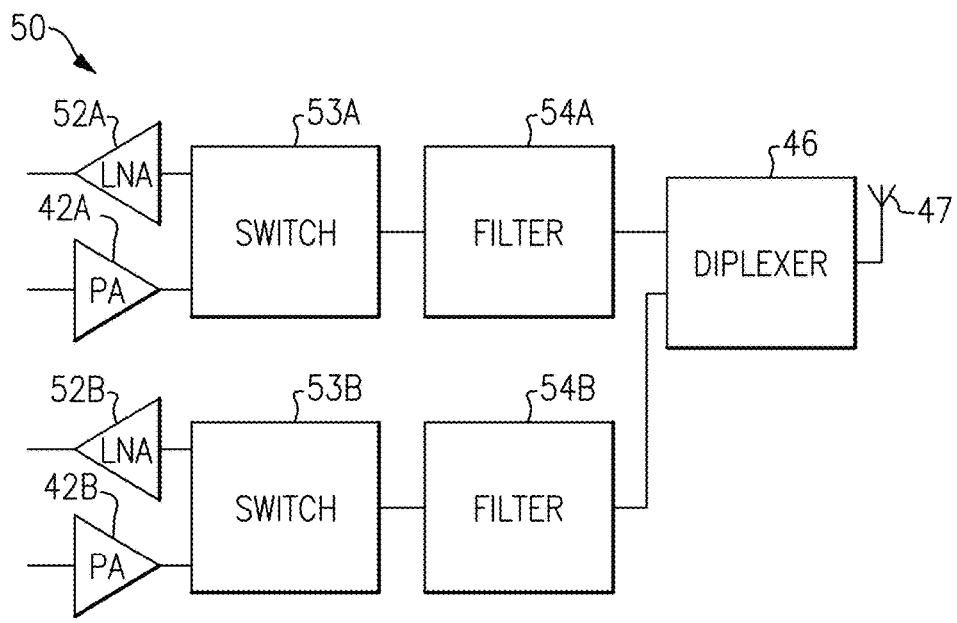

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
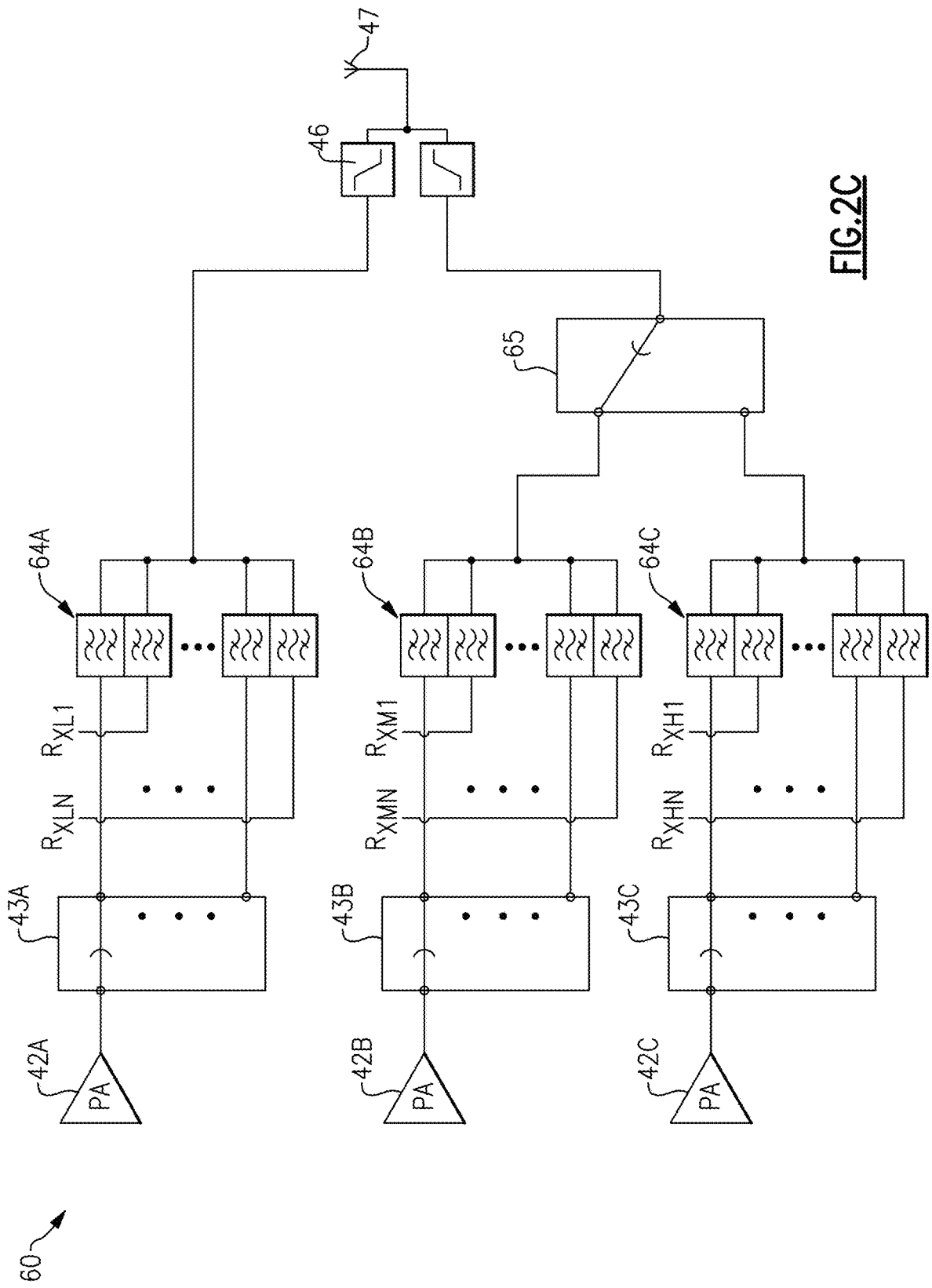

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A coupled to separate throws of the switch 75. Similarly, the illustrated duplexers 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figure 3A:
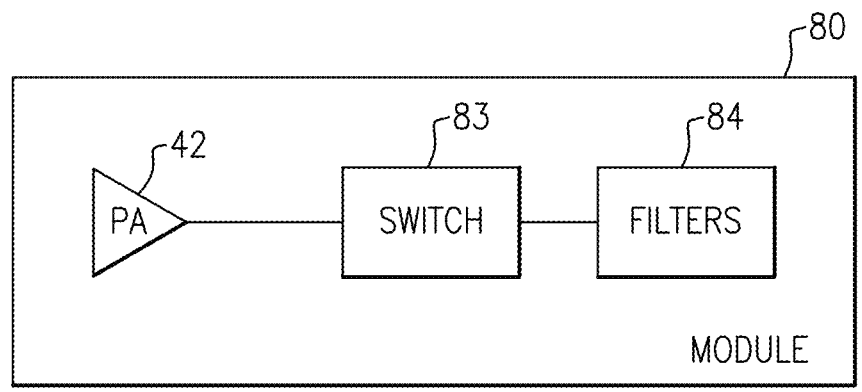
FIG. 3A is a schematic block diagram of a module that includes a filter.
Figure 3B:
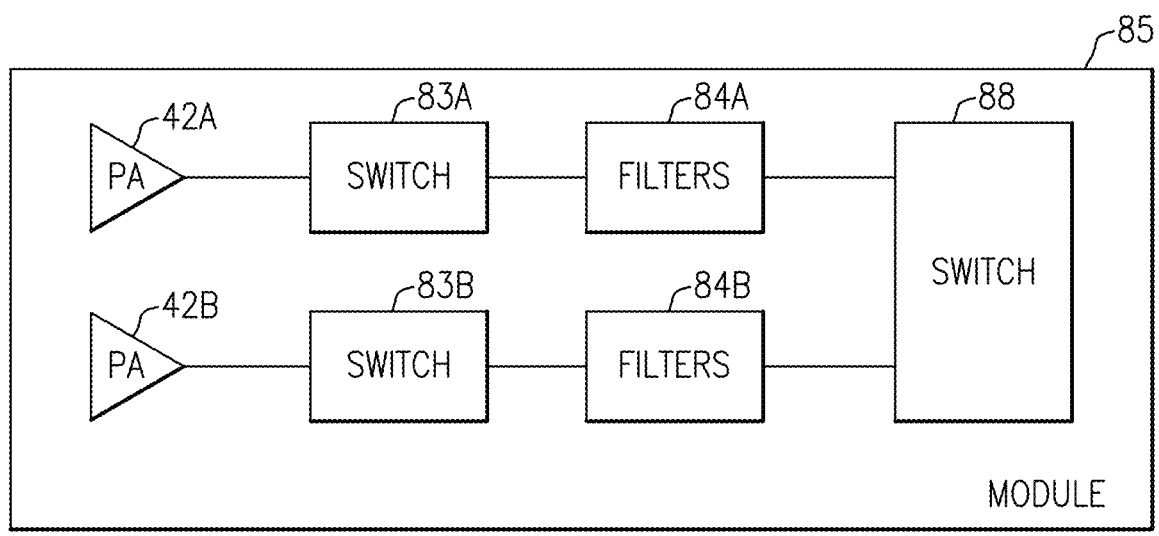
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 18A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

As discussed above, communication devices, such as mobile phones and the like, use filters and sub-systems incorporating filters (such as duplexers, diplexers, and the like) to separate signals in different frequency bands, such as transmission and reception signals, for example.

In recent years there has been an ongoing effort to continue to reduce the size and overall part count in communication devices such as mobile phones and the like. Furthermore, it is desirable to have even further improvement in the performance of filter devices that are used in such mobile communication devices.

In order to be able to build multiple structures on a single chip, investigations for implementing a multi-band filter on a single substrate have been undertaken. However, spurious responses potentially leading to degradation of the performance of the multi-band filter may occur. Such spurious responses may inter alia include, for example, shear horizontal (SH) wave propagation.

In some applications, SH wave propagation may prove to be quite valuable for applications involving wave propagation, including ultrasonic NDT. Traditionally, the longitudinal and vertical shear modes of wave propagation have been the most commonly used. However, the SH mode is generally undesirable for multi-band filters.

Therefore, it is desirable to suppress the SH mode for multi-band filters that are fabricated on a single substrate. One way to suppress the SH mode is to adjust the cut angle of the common substrate. The direction of cut determines the vibration mode of the crystal, its frequency-temperature characteristics, how it will age, and various other parameters. Therefore, the cut angle of the substrate influences the surface velocity and propagation direction and therefore filter performance. As used herein, a "cut angle" of N° refers to an N° rotated Y-cut in a Y-cut X-propagation piezoelectric layer. The substrate, for example, may be a piezoelectric substrate formed of lithium niobate (LN).

Since the multi-band filter is built on a single substrate, the cut angle of the substrate applies to whole frequency bands. Thus, the cut angle of the substrate can be selected based on overall performance for each of the multiple target frequency bands. For example, a cut angle of the substrate can be determined in favor of improving the performance of the largest number of frequency bands.

FIGS. 4A-4D show an example of measurement result on output power attenuation (dB) of a filter at each frequency band depending on a cut angle of the substrate. In this measurement, the cut angle of the substrate is 116, 118 or 120 degrees.

Figure 4A:
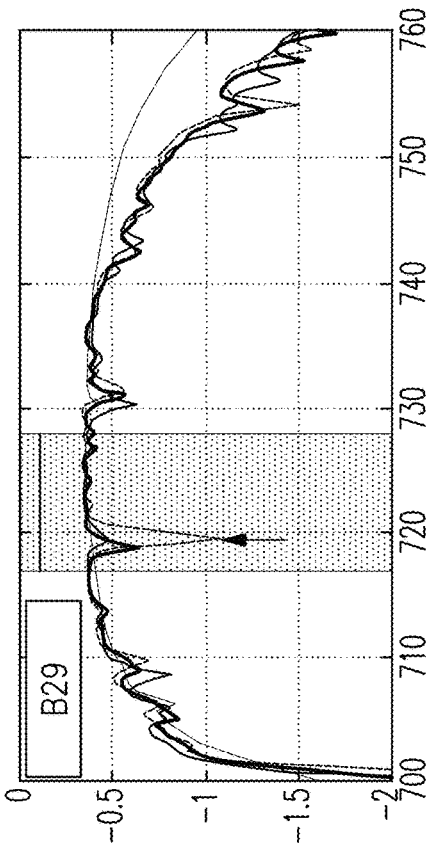
FIG. 4A is an example of measurement result on output power attenuation (dB) of a filter at frequency band B71F depending on a cut angle of the substrate.

FIG. 4A is an example of measurement result on output power attenuation (dB) of a filter at frequency band B71F depending on the cut angles of the substrate. As shown in FIG. 4A (shaded area), the frequency band B71F has a frequency range between, approximately, 617 MHz and 651 MHz. As indicated by an arrow in FIG. 4A, the SH mode of a filter depending on cut angle of the substrate leads to attenuation in the output power delivery of the filter. More specifically, the filter with the substrate having a cut angle of 120 degrees shows the most severe SH mode. Meanwhile, the filter with a substrate having a cut angle of 116 degrees exhibits the least attenuation of power delivery.

Figure 4B:
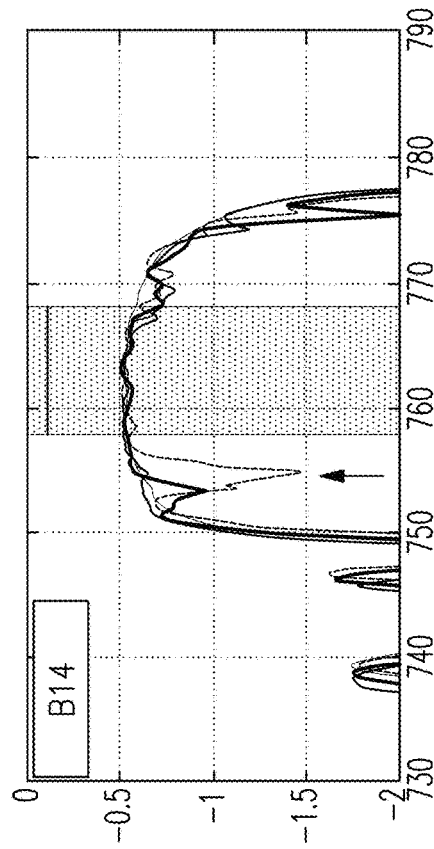
FIG. 4B is an example of measurement result on output power attenuation (dB) of a filter at frequency band B29 depending on a cut angle of the substrate.

FIG. 4B is an example of measurement result on power output attenuation (dB) of a filter at frequency band B29 depending on the cut angles of the substrate. As shown in FIG. 4B (shaded area), the frequency band B29 has a frequency range around 700 MHz, near 720 MHz. As indicated by an arrow in FIG. 4B, the filter with a substrate having cut angle of 116 degrees exhibits the most severe SH mode. Meanwhile, the filter with a substrate having a cut angle of 120 degrees has the least attenuation of power delivery.

Figure 4C:
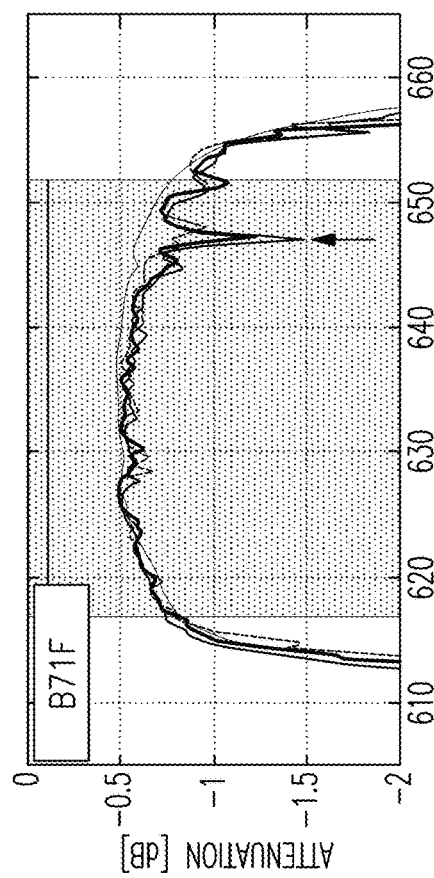
FIG. 4C is an example of measurement result on output power attenuation (dB) of a filter at frequency band B12+B13 depending on a cut angle of the substrate.

FIG. 4C is an example of measurement result on output power attenuation (dB) of a filter at frequency band B12+13 depending on the cut angles of the substrate. As shown in FIG. 4C (shaded area), the frequency band B12+13 has q frequency range between, approximately, 729 MHz and 756 MHz. As indicated by an arrow in FIG. 4C, the filter with a substrate having a cut angle of 116 degrees shows the most severe SH mode. Meanwhile, the filter with a substrate having a cut angle of 120 degrees has the least attenuation of power delivery.

Figure 4D:
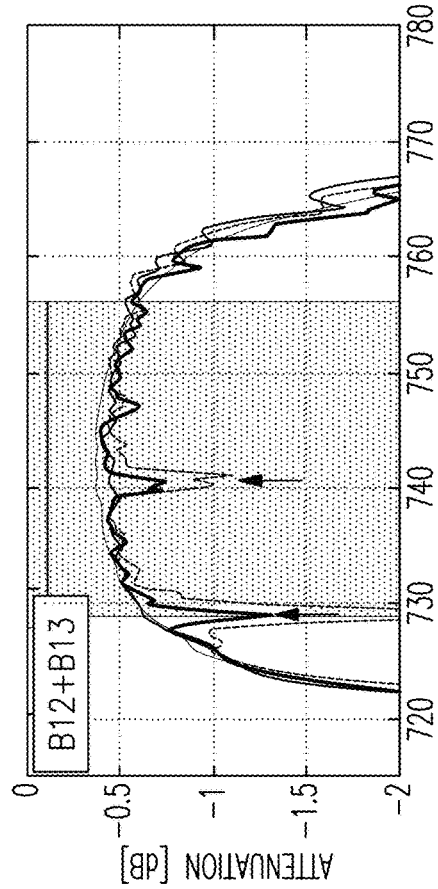
FIG. 4D is an example of measurement result on output power attenuation (dB) of a filter at frequency band B14 depending on a cut angle of the substrate.

FIG. 4D is an example of measurement result on output power attenuation (dB) of a filter at frequency band B14 depending on the cut angles of the substrate. As shown in FIG. 4D (shaded area), the frequency band B14 has a frequency range between, approximately, 758 MHz and 768 MHz. As indicated by an arrow in FIG. 4D, the filter with a substrate having a cut angle of 116 degrees exhibits the most severe SH mode. Meanwhile, the filter with a substrate having a cut angle of 120 degrees has the least attenuation of power delivery.

In this example, the cut angle of 120 degrees can be selected as the most suitable for the substrate to implement a multi-band filter encompass B71F, B29, B12+13 and B14. Even though the cut angle of 120 degrees for the substrate does not guarantee the best performance at frequency band B71F, the cut angle of 120 degrees can be regarded as the most suitable cut angle throughout the multiple frequency bands, because the substrate is common to the multiple frequency bands. Therefore, the cut angle of the substrate should be selected based on the overall performances in all frequency bands that are targeted.

It should be understood that any cut angle of the substrate can be selected according to the combination of the frequency bands.

Figure 5:
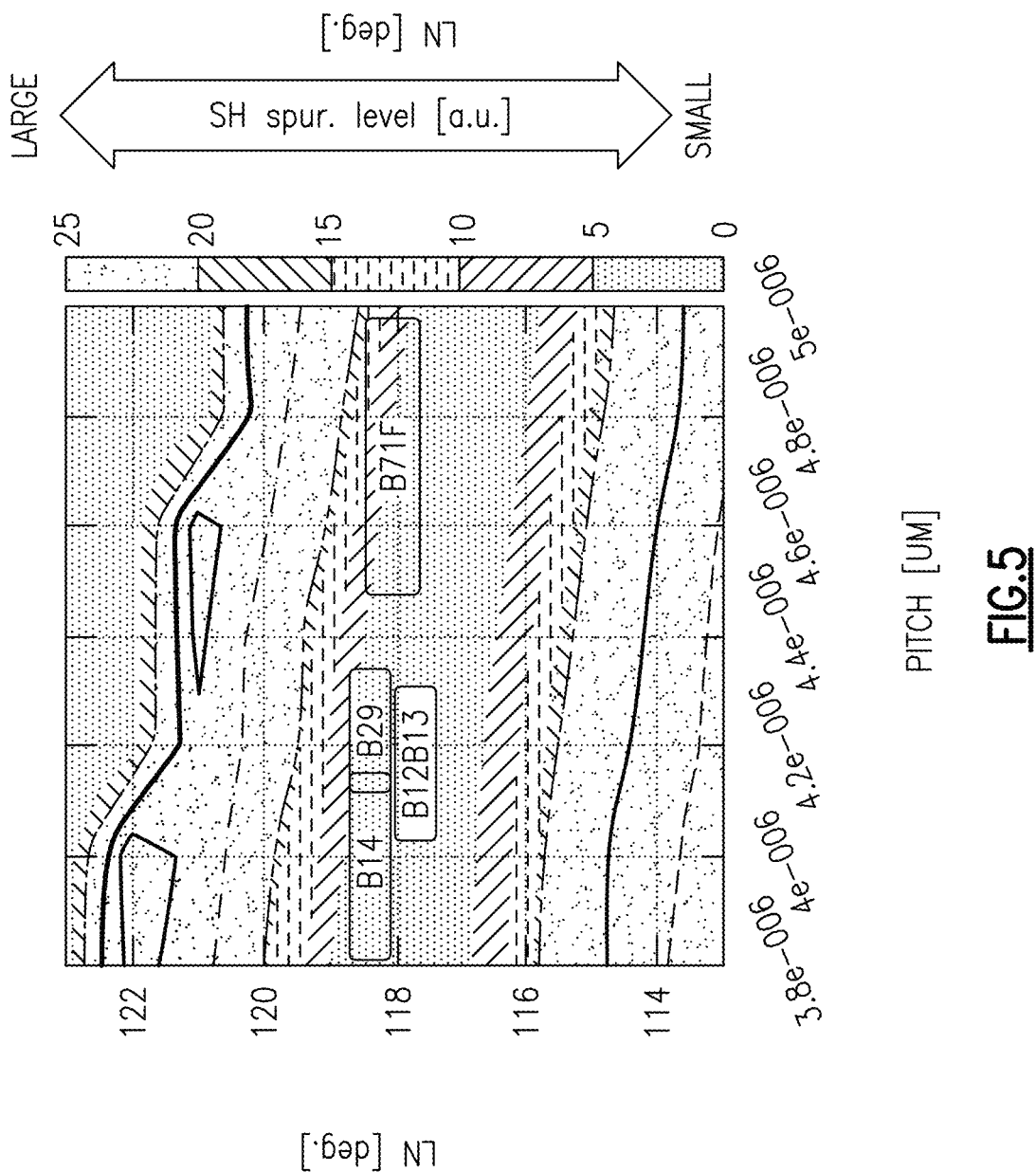
FIG. 5 shows an example of simulation configuration to derive results illustrated in FIGS. 4A-4D.

FIG. 5 is an example of simulation configuration to derive results illustrated in FIGS. 4A-4D. As shown in FIG. 5, the spurious degree of SH mode of filters depends on the cut angle of their substrates and the pitch distances between electrodes.

However, adjusting the cut angle of the substrate may in some instances not be enough to suppress the SH mode throughout the whole target multiple frequency bands. Therefore, it is describable to develop ways to further suppress the SH mode.

According to embodiments of the present disclosure, a multi-band filter with suppressed SH mode is provided. More specifically, the multi-band filter according to the embodiments of the present disclosure may have different thicknesses of the passivation film depending on the portions of multi-band filter corresponding to each frequency band. The passivation film serves to protect the filter device. The passivation film is formed on a dielectric film covering the electrodes of the filter. The passivation film may be formed of silicon nitride (SiN).

Figure 6:
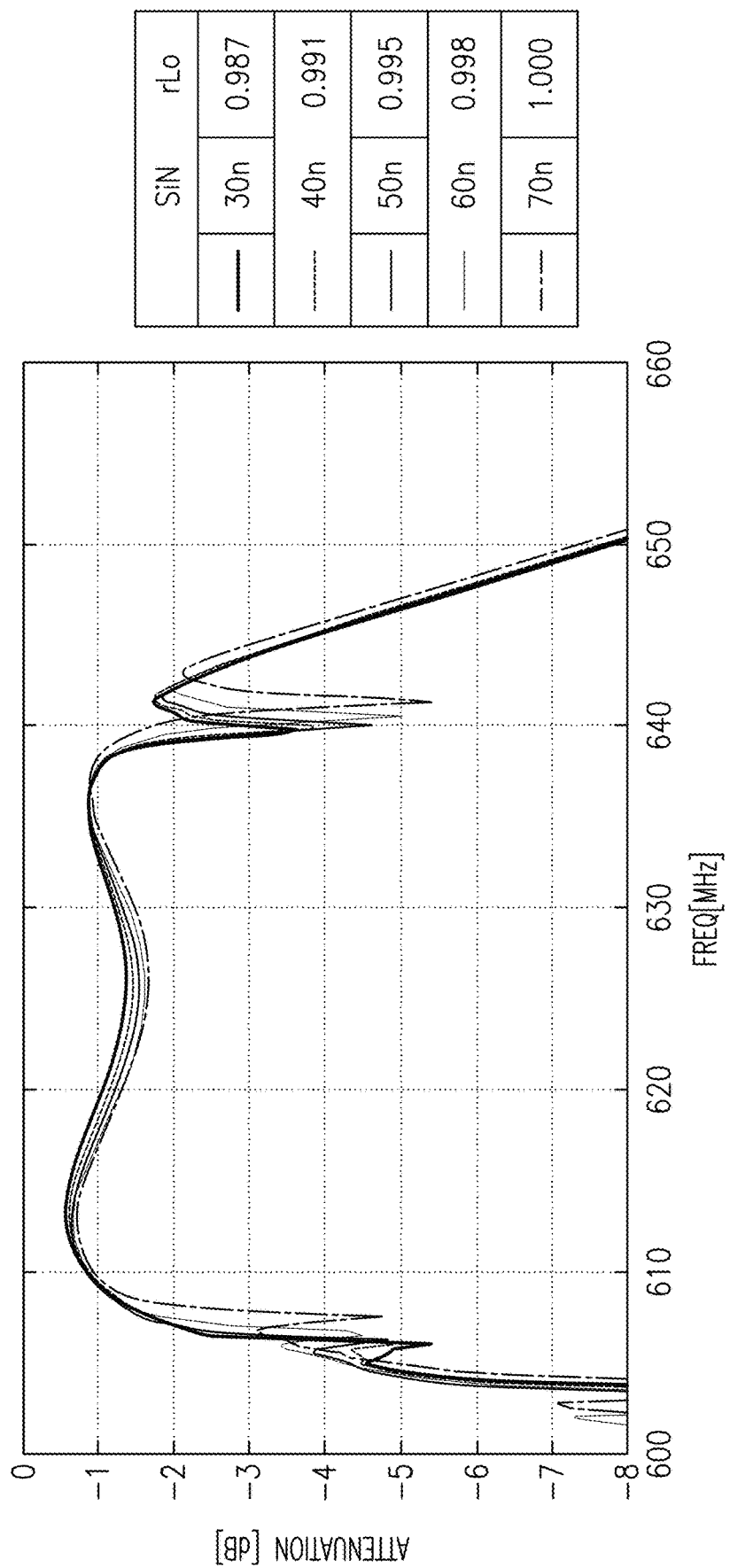
FIG. 6 is an example of the output power attenuation of a filter at frequency band B71F depending on a thickness of the passivation layer.

FIG. 6 is an example of the output power attenuation of a filter at frequency band B71F depending on a thickness of the passivation layer. As shown in FIG. 6, as the thickness of the SiN layer gets thinner, the attenuation of the power delivery around frequency 640 MHz is mitigated. For example, the SH mode of the filter with SiN layer thickness of 30 nm is significantly improved as compared to a SiN layer thickness of 70 nm. It is to be noted that the attenuation of power delivery around a frequency of 605 MHz originates from the design of the filter, not from the thickness of the SiN layer.

In the present disclosure, it is described that only the filter for frequency band B71F has to be adjusted, but the embodiments of the present invention are not limited thereto. Therefore, the filter corresponding to any other frequency band (for example, B14, B12+13, and B29) can also be adjusted by modifying the thickness of the SiN layer. In addition, the thickness of the SiN layer may not always be selected to be thinnest. That is, the thickness of the SiN layer can be determined based on not only the frequency bands, but also the materials used for the electrodes and the thickness of dielectric film, as will be described below.

Therefore, adjusting the thickness of the passivation film can be a key factor to suppress the SH mode spurious. According to embodiments of the present disclosure, the thickness of the passivation film can be adjusted differently depending on the frequency band. For example, a single filter device may have different thicknesses of its passivation film depending on a corresponding frequency band.

Figure 7:
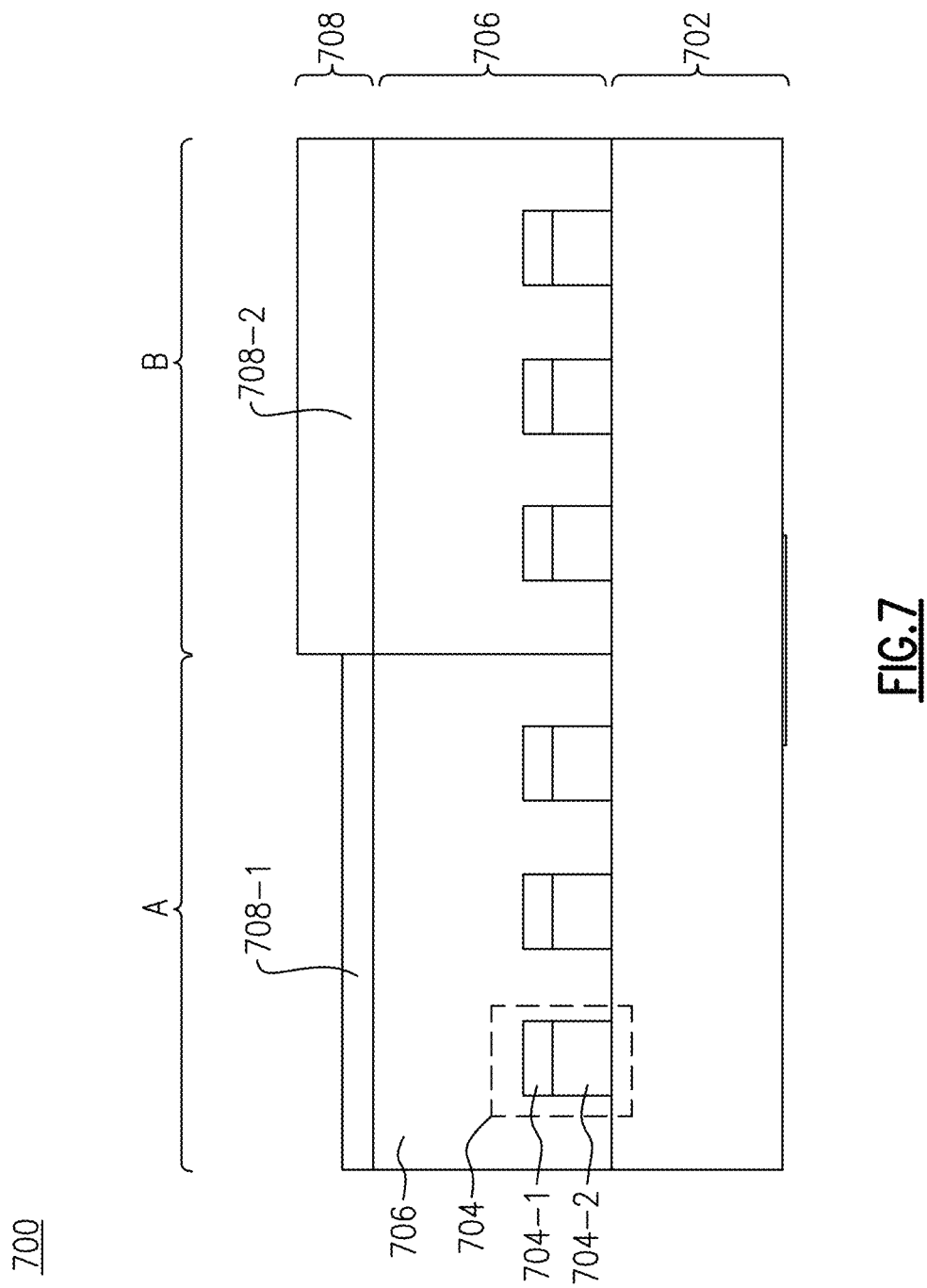
FIG. 7 is an example of schematic diagram of a multi-band filter according to an embodiment of the present disclosure.

FIG. 7 is an example of schematic diagram of a multi-band filter 700 according to an embodiment of the present disclosure. The multi-band filter 700 is configured to allow signals to pass at multiple frequency bands.

The multi-band filter 700 includes a substrate 702, a plurality groups of electrodes 704, a dielectric film 706 and a passivation film 708. The multi-band filter 700 can include multiple parts corresponding to each of multiple frequency bands. In this embodiment, the multi-band filter 700 may include two parts, e.g. A part and B part. The A part, for example, may be a part for filtering frequency band B71F. The B part, for example, may be a portion for filtering one of frequency bands B12+13, B14 and B29. Each part of the multi-band filter 700 for each frequency band may be referred to as a respective filter or a sub-filter forming the multi-band filter 700.

The substrate 702 is common to the respective filters of the multi-band filter 700. The substrate 702, for example, is a piezoelectric substrate formed of lithium niobate (LN). The substrate 702 has a cut angle selected to suppress spurious SH modes throughout the multiple frequency bands. In such embodiments, the SH mode spurious can be further suppressed by adjusting the thickness of the passivation film individually according to the respective frequency bands.

The plurality of groups of electrodes 704 are disposed on the substrate 702. The plurality of groups of electrodes 704 are configured to excite wave signals in the multi-band filter 700. The plurality of groups of electrodes may be formed of one of aluminum (Al), aluminum-magnesium-copper (AlMgCu) alloy, tungsten (W), platinum (Pt), and molybdenum (Mo). In this embodiment, the plurality of groups of electrodes include two groups of electrodes, e.g. A and B as illustrated in FIG. 7. Each group of electrodes forms a respective filter allowing signals to pass at a corresponding frequency band. That is, the groups of electrodes can be defined depending on the part of filter that is in charge of a certain frequency band.

Each of the plurality of groups of electrodes 704 may include an upper portion 704-1 and a lower portion 704-2. The upper portion of each electrode may be formed of, for example, one of aluminum (Al) and aluminum-magnesium-copper (AlMgCu) alloy. The lower portion of each electrode may be formed of, for example, one of tungsten (W), platinum (Pt), and molybdenum (Mo).

The dielectric film 706 is formed to cover at least a part of the substrate 702, and the plurality of electrodes 704. The dielectric film 706 is configured to provide a medium in which wave signals can propagate. The dielectric film 706 may be formed of silicon dioxide ($SiO_2$).

According to an embodiment of the present disclosure, the thickness of the dielectric film 706 can vary depending on its portion of the multi-band filter 700. More specifically, the thickness of the dielectric film 706 may also affect the SH mode of the multi-band filter 700. For example, in case of a wider band, the thickness of the dielectric film 706 can be thinner.

The passivation film 708 is configured to protect the multi-band filter 700 by providing a passivation effect. The passivation film 708 may be formed of silicon nitride (SiN). The passivation film 708 has different thicknesses for a first group of the electrodes as compared to a second group of electrodes. The first group and second group of electrodes can be defined based on the respective frequency band in which each group of electrodes is involved. Therefore, the optimal thickness of the passivation film 708 for each of the multiple frequency bands can be achieved individually to suppress SH modes efficiently. The passivation film 708 can be the outermost layer of the layered stack that forms the multi-band filter 700 and can provides passivation/protection. The passivation film 708 can be made of a different material (e.g., SiN) than the dielectric electric layer 706 (e.g., $SiO_2$).

According to this embodiment, the passivation film 708 can be divided into two parts 708-1 and 708-2. The passivation film corresponding to the first group of electrodes is the first part of passivation film 708-1, and the passivation film corresponding to the second group of electrodes is the second part of passivation film 708-2. However, the number of different parts of passivation film is not limited to two.

The thickness of each part 708-1, 708-2 of the passivation film 708 of the multi-band filter 700 can have a thickness selected based on a filtering frequency band of the part of the multi-band filter 700 to which the passivation film part 708-1, 708-2 corresponds. For example, the passivation film 708 can be thinner for lower filter frequency bands than for higher frequency bands. In the illustrated embodiment, for example, the A part of the filter 700 may be a part for filtering frequency band B71F, and the B part, for example, may be a portion for filtering one of frequency bands B12+13, B14 and B29. Because the B71F corresponds to a lower frequency band than B12+13, B14, and B29, the part 708-1 of the passivation film 708 corresponding to the A part of the filter 700 can have a smaller thickness (e.g., 40, 30, 20, 10 nm or less) than a thickness (e.g., 50, 60, 70 nm or more) of the part 708-2 of the passivation film 708 corresponding to the B part of the filter 700.

According to an embodiment, a thickness of the passivation film for the first group of the plurality groups of electrodes is determined further depending on a material that is used for the first group of the plurality groups of electrodes. In addition, a thickness of the passivation film for the first group of the plurality groups of electrodes is determined further depending on a thickness of the dielectric film covering the first group of the plurality of groups of electrodes.

It should be understood that the adjustment of thickness of the passivation film according to the present disclosure also can be adapted to a single resonator or a single frequency band filter.

Figure 8:
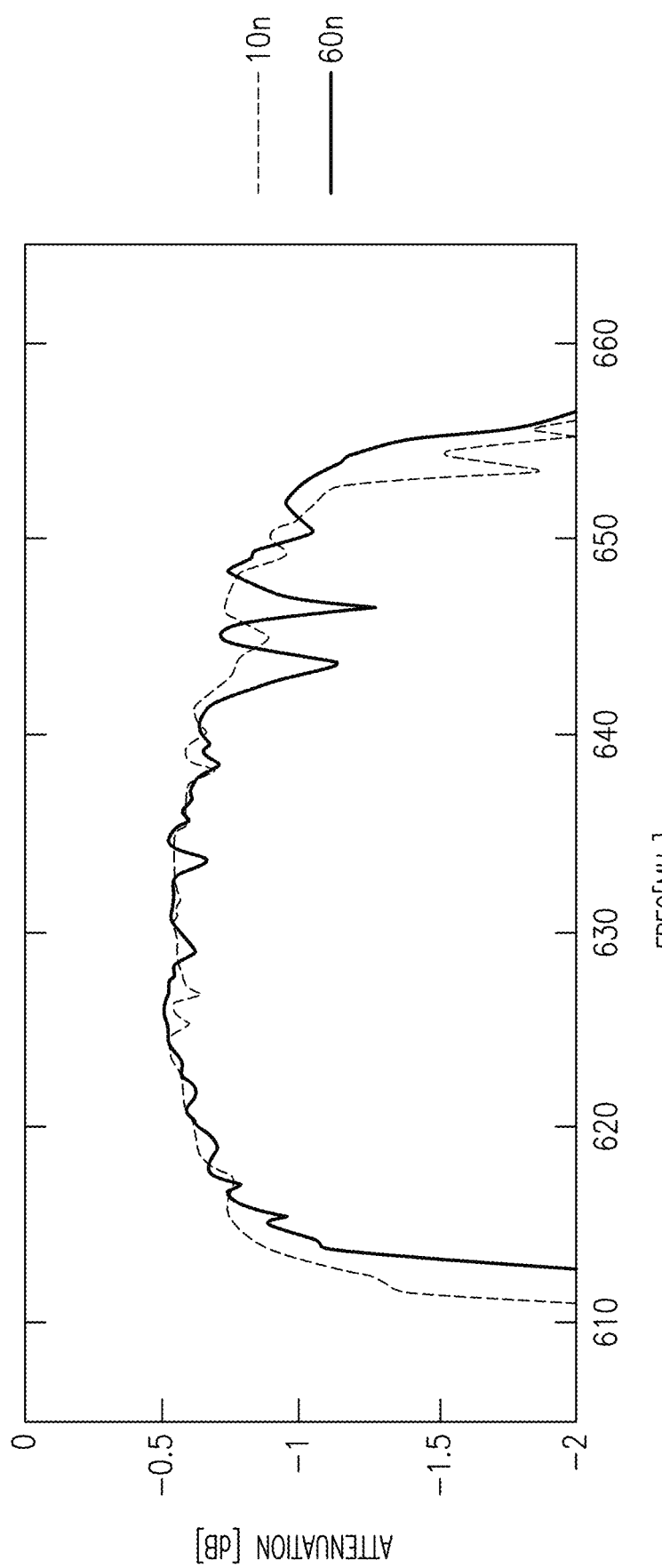
FIG. 8 is an example of measurement result showing an enhancement of output power delivery of a filter by adjusting the thickness of the passivation film.

FIG. 8 shows an example of measurement result showing an enhancement of output power delivery of a filter by adjusting the thickness of the passivation film.

As shown in FIG. 8, the thinner SiN layer (10 nm) leads to further improved output power delivery than thicker SiN layer (60 nm). Therefore, it can be seen that the thickness of SiN layer affects the spurious SH mode of the filter. However, as described above, a thinner SiN layer is not always a better solution to suppress SH modes than a thicker SiN layer.

According to embodiments of the present disclosure, the SH mode of the multi-band filter can be efficiently suppressed by adjusting the thickness of the passivation film 708 individually depending on a corresponding frequency band.

Figure 9A:
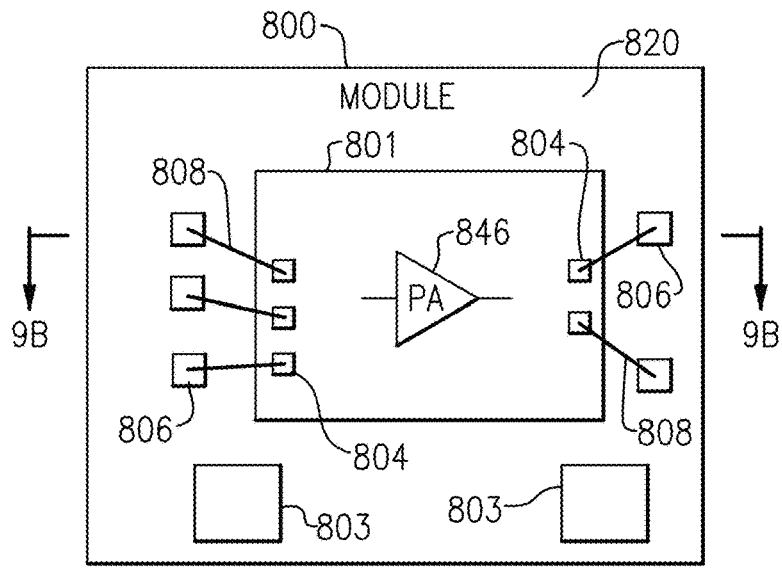
FIG. 9A is a schematic diagram of one embodiment of a packaged module.
Figure 9B:
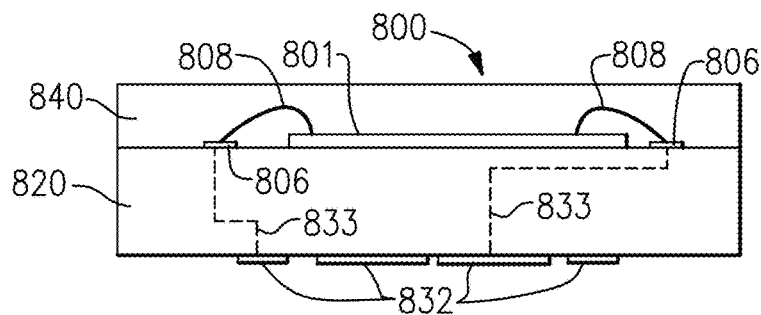
FIG. 9B is a schematic diagram of a cross-section of the packaged module of FIG. 9A taken along the lines 9B-9B.

FIG. 9A is a schematic diagram of one embodiment of a packaged module 800. FIG. 9B is a schematic diagram of a cross-section of the packaged module 800 of FIG. 9A taken along the lines 9A-9B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a filter module, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 9B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 16B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 10:
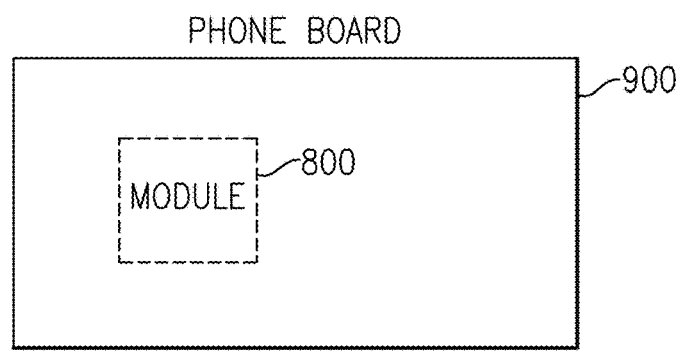
FIG. 10 is a schematic diagram of one embodiment of a phone board.

FIG. 10 is a schematic diagram of one embodiment of a phone board 900. The phone board 900 includes the module 800 shown in FIGS. 9A-9B attached thereto. Although not illustrated in FIG. 10 for clarity, the phone board 800 can include additional components and structures.

Figure 11A:
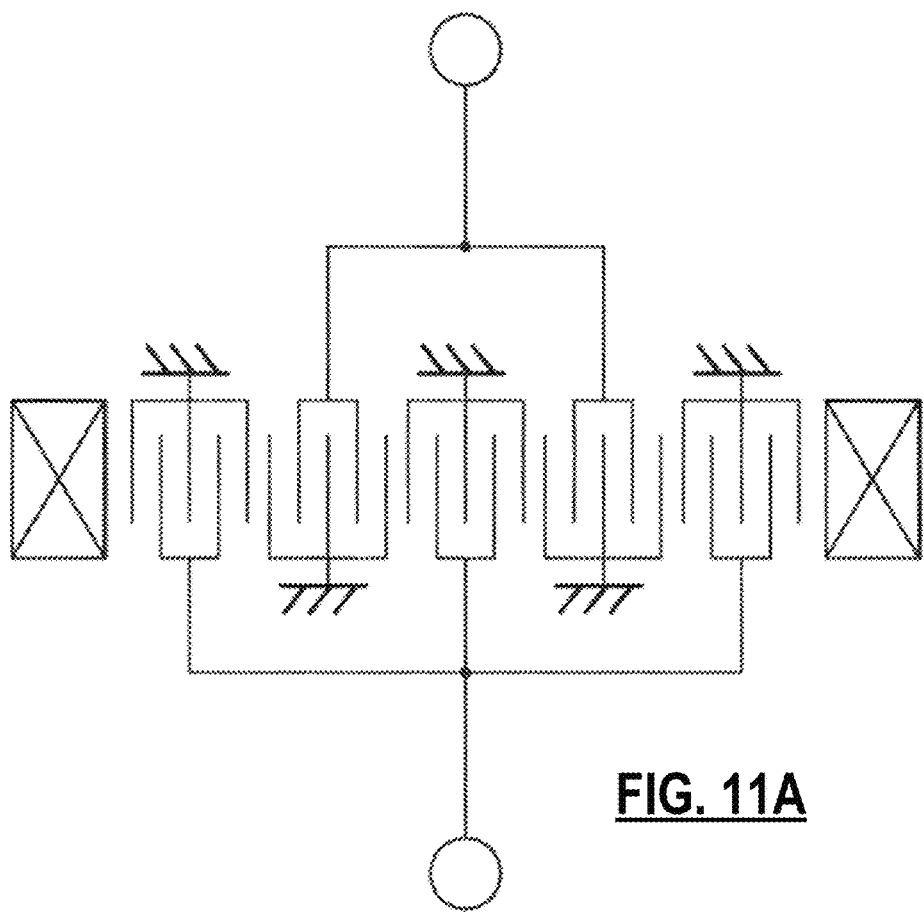
FIG. 11A illustrates an embodiment of a SAW resonator.
Figure 11B:
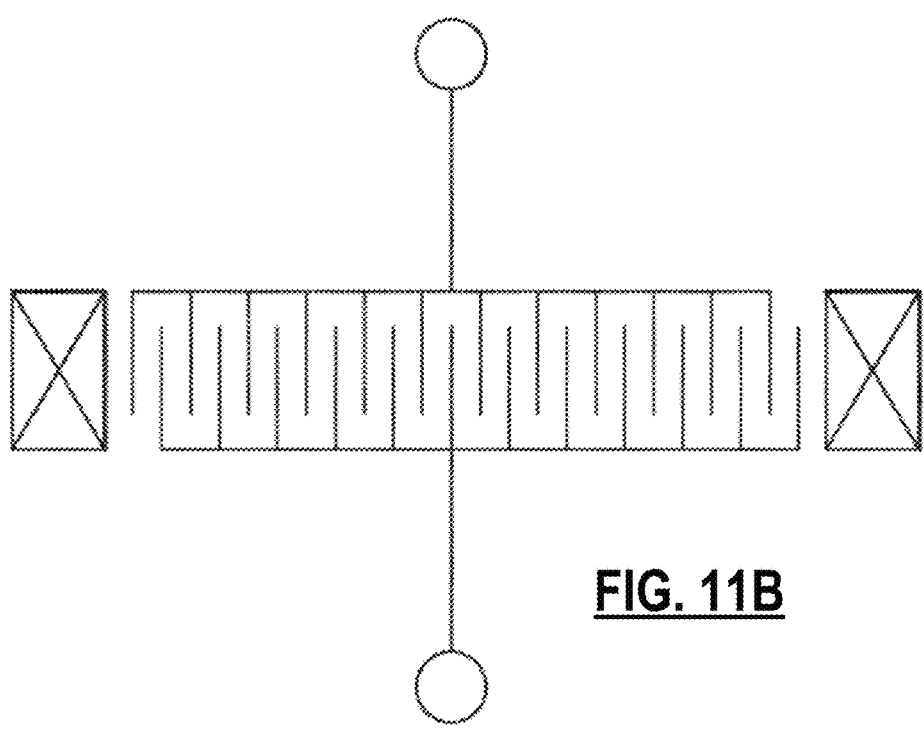
FIG. 11B illustrates an embodiment of a multi-mode SAW filter.

Any of the aspects and embodiments disclosed herein may be utilized in a SAW resonator, an example of which is illustrated in FIG. 11A, or a multi-mode SAW filter, an example of which is illustrated in FIG. 11B. The multi-mode SAW filter of FIG. 11B may be a dual-mode SAW filter (a DMS filter). Additional examples of SAW filters, including of multi-mode SAW filters, in which the aspects and embodiments disclosed herein may be utilized are disclosed in U.S. Pat. No. 11,489,513, issued Nov. 1, 2022, which is incorporated by reference in its entirety herein.

Applications

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multi-band filter configured to allow signals to pass at multiple frequency bands, the multi-band filter comprising:
   a piezoelectric substrate;
   a plurality of groups of electrodes disposed on the piezoelectric substrate, each group of the plurality of groups of electrodes forming a respective filter to allow signals to pass at a corresponding frequency band of the multiple frequency bands, a first group of the plurality of groups of electrodes forming a first filter having a first frequency band and a second group of the plurality of groups of electrodes forming a second filter having a second frequency band, the first frequency band lower than the second frequency band;
   a dielectric film formed to cover at least a part of the piezoelectric substrate and the plurality of groups of electrodes; and
   a passivation film disposed on the dielectric film, the passivation film having a smaller thickness for the first group than for the second group, so as to suppress a spurious response generated in the piezoelectric substrate.

2. The multi-band filter of claim 1 wherein the passivation film is an outermost layer in the multi-band filter.

3. The multi-band filter of claim 1 wherein the spurious response generated in the piezoelectric substrate is a shear horizontal (SH) wave.

4. The multi-band filter of claim 1 wherein a thickness of the passivation film for the first group of the plurality of groups of electrodes is determined further depending on a material that is used for the first group of the plurality of groups of electrodes.

5. The multi-band filter of claim 1 wherein each group of the plurality of groups of electrodes includes an upper portion and a lower portion.

6. The multi-band filter of claim 5 wherein the upper portion and the lower portion of each of the plurality of groups of electrodes are formed of one of aluminum (Al), aluminum-magnesium-copper (AlMgCu) alloy, tungsten (W), platinum (Pt), and molybdenum (Mo).

7. The multi-band filter of claim 1 wherein a thickness of the passivation film for the first group of the plurality of groups of electrodes is determined further depending on a thickness of the dielectric film covering the first group of the plurality of groups of electrodes.

8. The multi-band filter of claim 1 wherein the piezoelectric substrate has a cut angle that suppresses the spurious response generated in the piezoelectric substrate in at least one of the multiple frequency bands.

9. The multi-band filter of claim 1 wherein the dielectric film has a different thickness for the first group of the plurality of groups of electrodes from the second group of the plurality of groups of electrodes.

10. A radio frequency module comprising:
    a packaging board configured to receive a plurality of components;
    a multi-band filter implemented on the packaging board, the multi-band filter including: a piezoelectric substrate; a plurality of groups of electrodes disposed on the piezoelectric substrate, each group of the plurality of groups of electrodes forming a respective filter to allow signals to pass at a corresponding frequency band of multiple frequency bands, a first group of the plurality of groups of electrodes forming a first filter having a first frequency band and a second group of the plurality of groups of electrodes forming a second filter having a second frequency band, the first frequency band lower than the second frequency band; a dielectric film formed to cover at least a part of the piezoelectric substrate and the plurality of groups of electrodes; and a passivation film disposed on the dielectric film, the passivation film having a smaller thickness for the first group than for the second group, so as to suppress a spurious response generated in the piezoelectric substrate.

11. The radio frequency module of claim 10 wherein the passivation film is an outermost layer in the multi-band filter.

12. The radio frequency module of claim 10 wherein the spurious response generated in the piezoelectric substrate is a shear horizontal (SH) wave.

13. The radio frequency module of claim 10 wherein a thickness of the passivation film for the first group of the plurality of groups of electrodes is determined further depending on a material that is used for the first group of the plurality of groups of electrodes.

14. The radio frequency module of claim 10 wherein a thickness of the passivation film for the first group of the plurality of groups of electrodes is determined further depending on a thickness of the dielectric film covering the first group of the plurality of groups of electrodes.

15. The radio frequency module of claim 10 wherein the piezoelectric substrate has a cut angle that suppresses the spurious response generated in the piezoelectric substrate in at least one of the multiple frequency bands.

16. The radio frequency module of claim 10 wherein the dielectric film has a different thickness for the first group of the plurality of groups of electrodes from the second group of the plurality of groups of electrodes.

17. A mobile device comprising:
    an antenna configured to receive a radio frequency signal; and
    a front end system configured to communicate with the antenna, the front end system including a multi-band filter including: a piezoelectric substrate; a plurality of groups of electrodes disposed on the piezoelectric substrate, each group of the plurality of groups of electrodes forming a respective filter to allow signals to pass at a corresponding frequency band of multiple frequency bands, a first group of the plurality of groups of electrodes forming a first filter having a first frequency band and a second group of the plurality of groups of electrodes forming a second filter having a second frequency band, the first frequency band lower than the second frequency band; a dielectric film formed to cover at least a part of the piezoelectric substrate and the plurality of groups of electrodes; and a passivation film disposed on the dielectric film, the passivation film having a smaller thickness for the first group than for the second group, so as to suppress a spurious response generated in the piezoelectric substrate.

18. The mobile device filter of claim 17 wherein the passivation film is an outermost layer in the multi-band filter.

19. The mobile device of claim 17 wherein the spurious response generated in the piezoelectric substrate is a shear horizontal (SH) wave.

20. The mobile device of claim 17 wherein a thickness of the passivation film for the first group of the plurality of groups of electrodes is determined further depending on a material that is used for the first group of the plurality of groups of electrodes.

* * * * *